Figure 1:
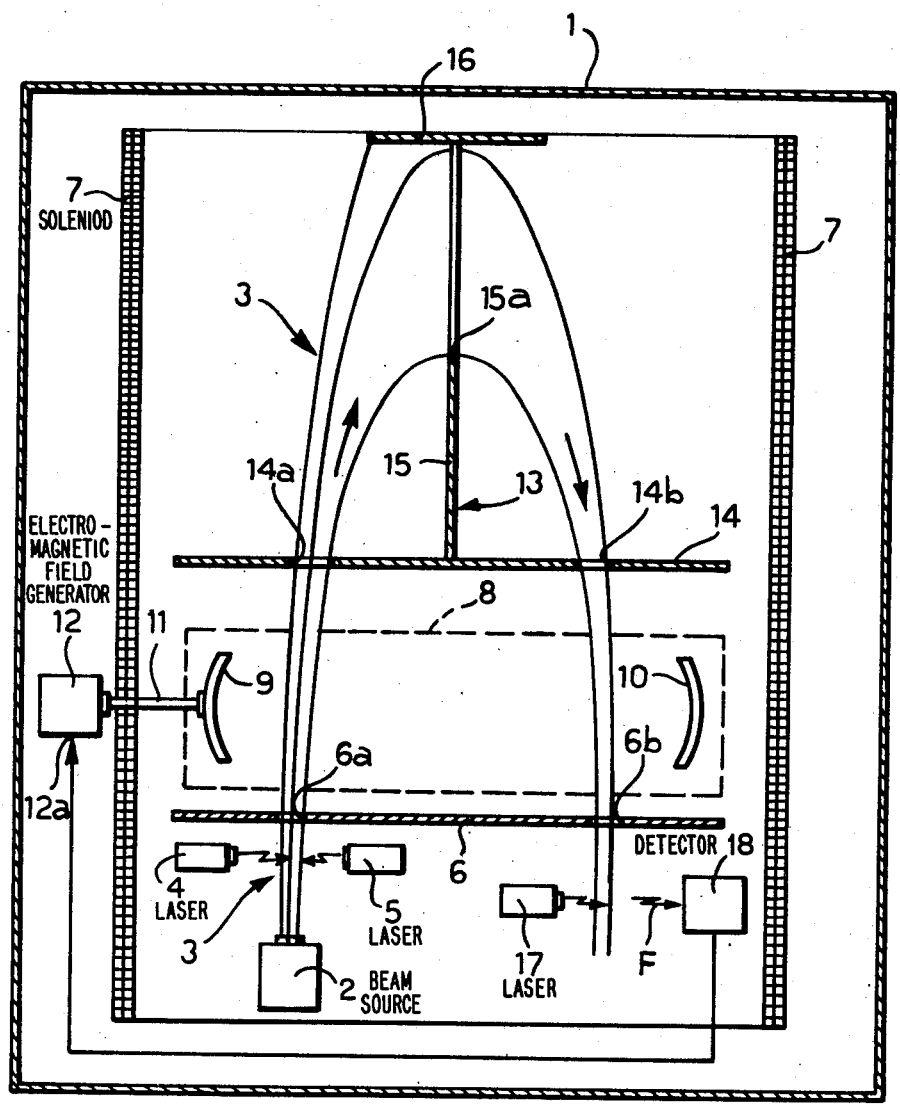

United States Patent [19]
DeMarchi

[11] 4,454,482
[45] Jun. 12, 1984

[54] ATOMIC OR MOLECULAR BEAM FREQUENCY STANDARD WITH OPTICAL PUMPING AND OPEN RESONATOR

[76] Inventor: Andrea DeMarchi, Via Sperino 13, Lessona (Vercelli), Italy

[21] Appl. No.: 310,254

[22] Filed: Oct. 9, 1981

[51] Int. Cl.³ .............................................. H03L 7/26
[52] U.S. Cl. ...................................... 331/3; 250/251; 331/94.1
[58] Field of Search ..................... 331/3, 94.1; 250/251

[56] References Cited

U.S. PATENT DOCUMENTS 3,667,066  5/1972  Kastler et al. ...................... 331/94.1
4,315,224  2/1982  Ezekiel et al. .......................... 331/3

OTHER PUBLICATIONS

Arditi et al., "A Cesium Beam Atomic Clock Using Laser Optical Pumping", J. Physique-Lettres, vol. 41, No. 16, Aug. 15, 1980, pp. L-379-L381.
Picque, "Hyperfine Optical Pumping of Cesium With a CW GaAs Laser", IEEE Journal of Quantum Electronics, vol. QE-10, No. 12, Dec. 1974, pp. 892-897.

Primary Examiner—Siegfried H. Grimm
Attorney, Agent, or Firm—Sughrue, Mion, Zinn, Moepeak, and Seas

[57] ABSTRACT

The apparatus comprises a source capable of producing an atomic (molecular) beam and at least one electromagnetic resonator of the open type through which the atoms (molecules) pass. Optical pumping means excite the atoms (molecules) of the beam into a selected energy level before the beam passes through the resonator. An electromagnetic field generator is connected to the resonator for generating inside said resonator a spatial distribution of electromagnetic field at a frequency corresponding to the difference between the energies associated to said first level or energetic state and a second level or energetic state of the atoms (molecules) in the beam. Detection means provide an electric signal indicative of the number of atoms (molecules) which inside the resonator undergo a transition to the above mentioned second level or energetic state. Said electric signal is used to control the frequency of said generator, in such a way as to maximize the number of atoms (molecules) which undergo a transition when they pass through said resonator.

10 Claims, 4 Drawing Figures

ATOMIC OR MOLECULAR BEAM FREQUENCY STANDARD WITH OPTICAL PUMPING AND OPEN RESONATOR

The present invention relates to an atomic (molecular) resonance apparatus particularly for the generation of a standard frequency, that is to say, for the stabilization of the frequency of a source.

The best results in terms of accuracy and long term stability have thus far been obtained with Cesium atomic beam apparatus, like those described, for example, in the U.S. Pat. Nos. 2,972,115 and 3,354,307 respectively. Such known apparatus comprise a source (oven) that generates and sends a Cesium atomic beam through a pair of polepieces of a first deflecting magnet, which produces a strongly nonuniform magnetic field. Said magnetic field spatially separates the atoms that are in the state to which a magnetic moment with a certain sign corresponds, from those having a magnetic moment with opposite orientation. The selected atoms successively interact, in two successive microwave resonant cavities, with an electromagnetic radiation having a frequency substantially equal to the frequency capable of causing the state transition (nuclear-spin inversion) of said atoms. The closer is the frequency of said radiation to the Cesium characteristic frequency (9,192,631,770 Hz), the greater is the number of atoms which invert their nuclear magnetic moment, that is to say they change state. A pair of polepieces of a second deflecting magnet affects the atoms emerging from the second cavity in such a way that only those which have undergone the microwave transition are directed towards a detector.

Among the most important parameters which is necessary to take into account in order to evaluate the performances of such apparatus are the accuracy (i.e. the relative frequency deviation uncertainty from the theoretical value) and the signal-to-noise-ratio.

The signal-to-noise-ratio depends on the number of Cesium atoms which interact with the electromagnetic radiation excited in the above mentioned resonant cavities. In known Cesium beam apparatus, since the resonant cavities apertures must necessarily be very small, it is necessary to use fast atomic beams, so that the number of atoms per unit time which interact with the radiation in said cavities be sufficiently high. A good signal-to-noise-ratio is in this way obtained at the expenses of the accuracy of the standard frequency, because a high velocity of the atoms makes non-negligible the second order Doppler effect, which is proportional to the square of the atomic velocity.

A further limitation to the accuracy attainable with known devices is related to the use of deflecting magnets in order to select the atoms that are in the desired state in view of the successive interaction inside the resonant cavities. These magnets cause a deflection of the atoms, which varies with their position in the beam, and is inversely proportional to their velocity. For this reason the phase difference experienced by the atoms from the interaction in the first cavity to the interaction in the second cavity is not the same for all atoms; this fact produces an accuracy limitation. See in regard to this point the following papers: D. J. Wineland: "The Cesium beam frequency standard—Prospects for the future"; Metrologia 13, 121–123, 1977; D. J. Wineland: "Limitations on longterm stability and accuracy in atomic clocks"; Proc. PTTI, 1979; F. L. Walls: "Prospect for advances in microwave atomic frequency standards", Proc. PTTI 1979.

The desires for high signal-to-noise-ratio and accuracy turn out to be incompatible in known apparatuses. Fast atoms allow a high-signal-to-noise ratio while slower atoms ought to be used to improve the accuracy (reduce the second order Doppler effect and the frequency shift due to phase difference in the two cavities).

Some existing Cesium beam apparatus realize the best attainable compromise between the mentioned incompatible requirements.

It is an object of the present invention to provide an atomic (molecular) resonance apparatus by which frequency standards, that is frequency stabilization of sources, may be obtained with a higher accuracy than is obtainable to date with the prior art apparatus, without dramatic reduction of the signal-to-noise-ratio.

In view of attaining this object the atomic (molecular) resonance apparatus according to the present invention includes:

- a source capable of generating a beam of atoms (molecules) of a same type;
- at least one electromagnetic resonator of the open type through which said atomic (molecular) beam passes;
- optical pumping means to produce transitions of the beam atoms (molecules) into a first selected level or energetic state, before said beam passes through said at least one resonator,
- an electromagnetic field generator device, connected to said at least one resonator, for generating inside said at least one resonator a spatial distribution of oscillating electromagnetic field at a frequency substantially corresponding to the energy difference between said first level or energetic state and a second level or energetic state of the beam atoms (molecules),
- detecting means providing an electric signal indicative of the number of beam atoms (molecules) which inside said at least one resonator have undergone a transition from said first to said second level or energetic state, and
- frequency control means connected to said detection means and said generator, for steering the frequency of said generator in such a way as to maximize the number of atoms (molecules) which undergo a transition from said first to said second level or energetic state while passing through said at least one resonator.

A further feature of the present invention is the fact that the said source generates an atomic (molecular) beam directed almost vertically upward, in a fountain configuration.

Furthermore, the apparatus may include a single electromagnetic resonator of the open type, through which said beam passes a first time going up and a second time coming back down.

Figure 2:
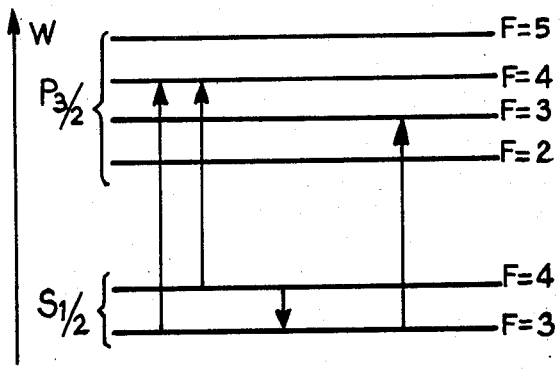
Figure 3:
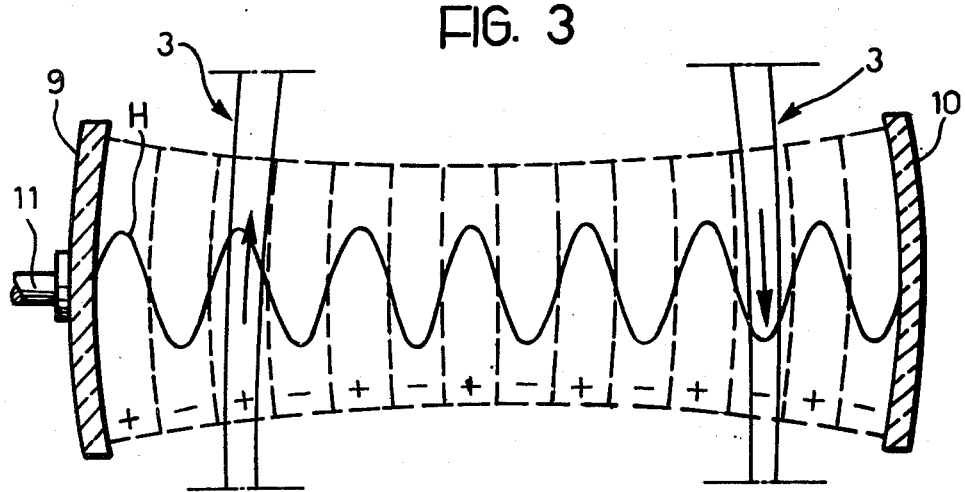
Figure 4:
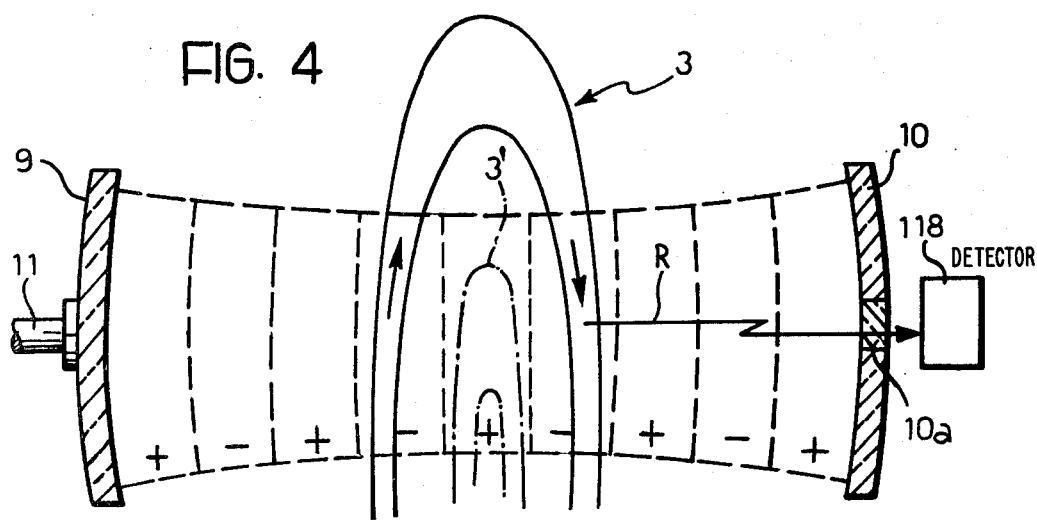

Further characteristics and advantages of the present invention are pointed out in the following detailed description, carried out with reference to the attached drawings, to be understood as a non-limitative example and not as a limitation, in which:

FIG. 1 is scheme partly in the form of a block diagram, which illustrates a preferred embodiment form of the device according to the invention, FIG. 2 is a diagram which schematically shows the levels or energetic states of the Cesium atoms employed in the device according to the invention, FIG. 3 illustrates, in enlarged scale, an electromagnetic resonator of the open type, employed in the device of FIG. 1, and FIG. 4 shows a detail of an alternative embodiment of the device of FIG. 1.

A preferred embodiment of the apparatus according to the invention is described in the following.

With reference to FIG. 1 a magnetic shield enclosure is indicated with 1, inside which vacuum is made and the apparatus according to the present invention is placed. The apparatus comprises a source or oven 2 capable of producing a Cesium atomic beam 3 directed almost vertically upward, in a fountain configuration. Said source 2 is supported (in a way not shown) in a fixed position, in the lower part of the enclosure 1. The Cesium atoms produced by the source 2 follow their own parabolic trajectory, because of gravity acceleration.

A first and a second source of monocromatic laser radiation, supported in a not shown way in fixed positions above the source or oven 2, are indicated with 4 and 5. The laser sources 4 and 5 shine their emitted radiation in the same region on the atomic beam 3 generated by the source 2.

The diagram of FIG. 2 illustrates six levels or energetic states of the cesium atom. To each one of these levels an energy W corresponds, which is indicated on the vertical axis.

The atoms emitted by the source 2 may be in the level $S_{\frac{1}{2}}$, F=3 or in the level $S_{\frac{1}{2}}$, F=4. The frequencies of the laser radiations from the laser sources 4 and 5 are respectively equal to the frequencies necessary to excite the transitions $S_{\frac{1}{2}}$, F=3→$P_{3/2}$, F=4 and $S_{\frac{1}{2}}$, F=4→$P_{3/2}$, F=4.

The laser sources 4 and 5 may be realized, for example, with stabilized dye lasers or with diode lasers, or with similar conventional coherent monocromatic sources. With 6 a slab is indicated, which is supported horizontally inside the enclosure 1 above the region where the cesium atom beam interacts with the radiation emitted by the laser sources 4 and 5. Such slab 6 has a pair of holes 6a and 6b to be passed by the cesium atoms during the upward leg and the downward leg of their trajectory respectively. The dimensions of said apertures are selected in such a way that the cross-section of the atomic beam emerging from said apertures be of the desired area and shape.

Inside said shielding enclosure 1 a cylindrical solenoidal inductive winding 7 is placed in which a DC electric current is maintained in a non represented way. Said solenoid winding is directed with its longitudinal symmetry axis vertical. The current flowing in said solenoidal winding generates a stationary magnetic field whose direction is vertical. Such magnetic field serves the purpose of splitting the sublevels of the cesium atoms by establishing a quantization axis and diversifying the energy of the sublevels. The laser radiation emitted by the source 5 has its magnetic field polarized perpendicularly to the field generated by the solenoid 7, that is to say its oscillating magnetic field is substantially horizontal. The laser sources 4 and 5 act as an "optical pump" for the cesium atoms toward the level or energetic state $P_{3/2}$, F=4. This latter level is unstable, as a result the cesium atoms decay spontaneously in a very short time back to the $S_{\frac{1}{2}}$ levels. From these levels the atoms are pumped again (by the same laser radiations) to the level $P_{3/2}$, F=4 except for those which are in the Zeeman magnetic sublevel $S_{\frac{1}{2}}$, F=4, $m_F$=0. The overall result of this process is that all atoms emerge from the pumping region in the $S_{\frac{1}{2}}$, F=4, $m_F$=0 magnetic sublevel.

Inside the winding 7, and above the slab 6, an open electromagnetic resonator 8 of a conventional design, is placed. This is made of a pair of mirrors 9 and 10 facing each other across the fountain. Said mirror 9 is connected, for example, with a waveguide 11, to an electromagnetic field generator 12 whose frequency is controllable about the characteristic frequency $\nu$ of the transition between the levels $S_{\frac{1}{2}}$, F=4, $m_F$=0 and $S_{\frac{1}{2}}$, F=3, $m_F$=0 of cesium. Such frequency is well known to be 9,192,631,770 Hz. In the region between the mirrors 9 and 10 of the resonator 8 an electromagnetic field distribution is excited with the well known configuration of the fundamental Gaussian mode. Such configuration is schematically shown in FIG. 3, which shows in enlarged scale the open resonator 8. As it appears from the figure a sinusoidal distribution of magnetic field (as indicated by the sinusoid labelled H) is generated in the region between the mirrors and the cesium atom beam is passed at two magnetic field antinodes. The cesium atomic beam may be passed at two opposite sign antinodes (as indicated in FIG. 3) or at two equal sign antinodes. In all cases the maximum transversal dimension of the beam must be less than $\lambda/2$, where $\lambda$ is the wavelength corresponding to the characteristic frequency $\lambda$. Therefore also the transversal dimension of the apertures 6a and 6b in the slab 6 must be less than $\lambda/2$.

Inside the shielding enclosure 1, above the resonator 8, a beam shaping structure is held in place, which is indicated as a whole with 13. Such structure is basically shaped like an upside down T, and includes a lower slab 14 supported horizontally and providing two apertures 14a and 14b through which the cesium beam passes going up and going down respectively. Said structure 13 further includes a slab 15 placed vertically and having in its top section an aperture 15a through which the cesium atoms pass when they reach the top of their parabolic trajectory. At the top of said slab 15 a further slab 16 is placed horizontally which serves the purpose of stopping the fast atoms of the beam emerging from the aperture 14a of the slab 14. The slab 6 and the structure 13 described above realize both a geometric shaping of the beam, and a velocity selection of the atoms. Said slab 6 and said structure 13 in fact allow to pass only the atoms, in the beam generated by said source 2, which have velocities between selected minimum and maximum values. Such values are determined by the dimensions of the apertures of slab 6 and the structure 13.

As already mentioned, the cesium beam interacts with the electromagnetic mode in the open resonator a first time while going up and a second time while coming back down. The accurate shaping of the beam obtainable by said structures guarantees that said two interactions are in perfect phase relation.

The atomic beam emerging below the slab 6, through the aperture 6b of the same, is successively irradiated with the radiation produced by the laser source 17. Such radiation has a frequency corresponding to the transition between the levels $S_{\frac{1}{2}}$, F=3 and $P_{3/2}$, F=2 (see FIG. 2) of the cesium atom. Fluorescence photons are hence emitted by the atoms that are found in the $S_{\frac{1}{2}}$, F=3 level, as they decay from said $P_{3/2}$, F=2 level to said $S_{\frac{1}{2}}$, F=3 level in the optical pumping process. Such fluorescence photons (indicated schematically with the arrow F in FIG. 1) are then collected by a detecting device 18 of a conventional kind. Said detector 18 provides at its output an electric signal indicative of the intensity of the fluorescence radiation F collected. Said electric signal is sent to a frequency control input 12a of the electromagnetic field generator 12, and is there used to realize an automatic frequency correction in such a way that the latter be as near as possible to the characteristic frequency $v$.

The frequency of said generator 12 is therefore stabilized to a high degree of accuracy, and can be used as a primary frequency standard.

The device described above has the following advantages. The use of an open resonator allows the use of atomic beams with a wide cross-section, and as a consequence with a high atomic flux. It is therefore possible to select, for the interaction in the resonator 8, atoms characterized by a low velocity. The high number of atoms available as a consequence of the wide beam cross-section allows high signal-to-noise ratios to be obtained, even though the atoms selected for the interaction in the resonator are slow.

The low velocity of the interacting atoms causes a small second order Doppler effect, which is proportional to the square of the atomic velocity, as mentioned above. This fact implies an improvement in the frequency accuracy of the generator 12 which is far better than the accuracy obtainable with devices according to known prior techniques.

A further accuracy improvement comes from the perfect phase relation between the two successive interactions of the atoms with the field excited in the resonator 8.

In FIG. 4 a partially modified and alternative embodiment of the device of FIG. 1 is shown.

According to such alternative embodiment said resonator 8 is placed, within said shielding enclosure 1, near the top of the parabolic trajectories of a selected velocity group of the atoms of the beam 3. As a consequence the time spent by the cesium atoms inside said resonator 8 turns out to be very long (tenths of a second). Said atoms enter the resonator in the state $S_{\frac{1}{2}}$, $F=4$, $m_F=0$ to which they are optically pumped by said laser sources 4 and 5; during the time spent within said resonator 8 they may radiate photons at the cesium characteristic frequency which may sustain a resonance radiation inside said tuned resonator thereof producing a maser effect. As a consequence radiation at the cesium characteristic frequency (symbolized by the arrow R in FIG. 4) may be extracted from said resonator, for example through a semi-reflecting portion 10a of the mirror 10, and collected by a detector 118. Detector 118 is sensitive to the frequency of the said radiaton and produces a signal indicative of said frequency, which can be used for the frequency stabilization of the source 12. For that purpose the frequency of source 12 must be compared with the frequency of the detected radiation. If detector 118 includes a mixer, the said frequency comparison can be accomplished in detector 118 itself. In this case, the output signal from detector 118 varies also as a function of the frequency of source 12.

According to the alternative embodiment of FIG. 4, in order to detect the atoms that have undergone a transition as an effect of the interaction with the electromagnetic field inside said resonator 8 and for the successive frequency control of said generator 12, it may not be necessary to employ the laser source 17 of FIG. 1. In the realization scheme of FIG. 4 it is necessary that the atomic beam crosses the region between the mirrors at two magnetic field antinodes of the same sign, or else that it does not go out of a single antinode region (as indicated for the beam 3' in the figure).

The alternative realization illustrated in FIG. 4 has the advantage, with respect to traditional maser devices, that the atoms interacting with the electromagnetic radiation inside the resonator are completely free when they produce the maser effect, and do not have to interact with the walls of a cell, which produces a frequency drift in existing devices. With respect to atomic resonance devices according to existing techniques, the alternative realization scheme illustrated in FIG. 4, has the same advantages of the realization scheme described with reference to FIG. 1. Said advantages, as described above, derive basically from the possibility of using atomic beams with wide cross-section and relatively slow atoms. For these reasons high signal-to-noise ratio and high accuracy can be obtained at the same time, the latter being reached because of the substantial reduction of the second order Doppler effect, and because of the precise phase relation existing between the two interactions of the atomic beam with the field excited within the resonant cavity.

Further variations of realization (not illustrated here) may be conceived and realized according to the principles of the present invention.

It is believed for example, that a substantial improvement of the signal-to-noise ratio and of the accuracy may be obtained by substituting in the configuration of traditional devices (see for example FIG. 1 of U.S. Pat. No. 3,354,307) the selecting magnets with laser sources, in such a way to realize with an optical pumping action the selection of the state in the atoms to be interrogated in the resonant cavities. A further improvement, according to the present invention, may be obtained by substituting, in the configuration of devices built according to previous art, the closed cavity resonators with open resonators of the type described above.

Resorting to apparatus capable of producing optical pumping, and employing one or more open resonators, are basic characteristics of the present invention.

It is therefore to be understood that also modifications to the scheme of previous art, in the sense of adopting in such schemes open type resonators and optical pumping means to realize the state selection for the atoms to be interrogated in the resonators, be within the scope of the present invention.

In the preceding description cesium atomic beam apparatus have been illustrated and reference was made to a particular transition between two well defined levels or states of the cesium atom. However, it is obvious that different atoms or molecules may be used, and that the various transitions induced in the atoms by the interaction with electromagnetic fields and in one or more resonators may involve different levels or energetic states from the ones mentioned above.

Having described the invention I claim:

1. An atomic (molecular) resonance apparatus, particularly for the generation of a standard frequency, including:

a source capable of generating a slow atomic beam of atoms (molecules) of one type, directed almost vertically upward in a fountain configuration, a single electromagnetic open resonator through which said atomic (molecular) beam passes a first time going up and a second time coming back down, optical pumping means to produce transitions of the beam atoms (molecules) into a first selected level or energetic state, before said beam passes through said resonator, an electromagnetic field generator device, connected to said resonator capable of generating inside said resonator a spatial distribution of oscillating electromagnetic field at a frequency substantially correspondent to the energy difference between said first level or energetic state and a second level or energetic state of the beam atoms (molecules), detecting means capable of providing an electric signal indicative of the number of beam atoms (molecules) which inside said resonator have undergone a transition from said first to said second level or energetic state, and, frequency control means connected to said detecting means and said generator, and capable of steering the frequency of said generator in such a way as to maximize the number of atoms (molecules) which undergo a transition from said first to said second level or energetic state while passing through said resonator.

2. Apparatus according to claim 1 including also selecting means capable of allowing through said resonator only the beam atoms (molecules) which have an initial velocity between a first and a second selected value.

3. Apparatus according to claim 2, in which said selecting means are also capable of determining the cross-section of the beam crossing said resonator, and the positioning of said beam inside the resonator.

4. Apparatus according to claim 1, in which said electromagnetic resonator is positioned at the height at which a selected velocity group of said atomic (molecular) beam reaches the top of its parabolic trajectory.

5. Apparatus according to claim 4, in which said resonator includes a pair of mirrors facing each other, at least one portion of one of said mirrors being at least partially transparent for the electromagnetic field, and in which said detecting means include sensors capable of producing an electric signal indicative of the frequency of the radiation emerging, during operation, from said partially transparent portion of one of said mirrors.

6. Apparatus according to any of the preceding claims in which said source generates a cesium atomic beam, and said optical pumping means induce the following state transitions in sid cesium atoms:

$S_{\frac{1}{2}}, F=3 \rightarrow P_{3/2}, F=4$ and $S_{\frac{1}{2}}, F=4 \rightarrow P_{3/2}, F=4.$ 7. Apparatus according to claim 6, in which said optical pumping means comprise first and second laser radiation generators, whose frequencies correspond respectively to the difference between the energies associated to the states $P_{3/2}$, F=4 and $S_{\frac{1}{2}}$, F=3, and between the energies associated to the states $P_{3/2}$, F=4 and $S_{\frac{1}{2}}$, F=4 of the cesium atom.

8. Apparatus according to claim 7, including means to generate a uniform magnetic field directed vertically in the region where said beam passes.

9. Apparatus according to claim 8, in which said second generator of laser radiation is set to generate an electromagnetic radiation having its magnetic field polarized horizontally.

10. Apparatus according to claim 6, in which said detecting means include second optical pumping means capable of inducting the transition from the state $S_{17\frac{1}{8}}$, F=3 to the state $P_{3/2}$, F=2 of the cesium atom, and sensors capable of providing an electric signal indicative of the intensity of the fluorescence radiation emitted by the cesium atoms pumped to the state $P_{3/2}$, F=2 by said second optical pmping means.

* * * * *